(12) United States Patent
Niizato (10) Patent No.: US 7,795,095 B2
(45) Date of Patent: Sep. 14, 2010

(54) METHOD OF PRODUCING SEMICONDUCTOR DEVICE

(75) Inventor: Masahiro Niizato, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 132 days.

(21) Appl. No.: 12/289,880

(22) Filed: Nov. 6, 2008

(65) Prior Publication Data

US 2009/0170264 A1    Jul. 2, 2009

(30) Foreign Application Priority Data

Nov. 13, 2007    (JP) .............................. 2007-294819

(51) Int. Cl.
*H01L 21/326* (2006.01)
(52) U.S. Cl. ...................... 438/268; 438/455; 438/931; 257/E29.104; 257/E29.262
(58) Field of Classification Search ................ 438/133, 438/135–138, 192, 212, 268, 455–460, 931; 257/E29.066, E29.104, E29.262
See application file for complete search history.

(56) References Cited

U.S. PATENT DOCUMENTS 6,162,665 A * 12/2000 Zommer ..................... 438/133
6,573,534 B1 * 6/2003 Kumar et al. ................. 257/77

FOREIGN PATENT DOCUMENTS

JP    2005-353771    12/2005

* cited by examiner

*Primary Examiner*—Brook Kebede
(74) *Attorney, Agent, or Firm*—Kubotera & Associates LLC

(57) ABSTRACT

A silicon carbide substrate has a first main surface and a second main surface opposite to the first main surface. A first conductive type impurity is diffused in the silicon carbide substrate. A method of producing a semiconductor device includes preparing the silicon carbide substrate forming a first conductive type impurity diffused region on the first main surface therein; preparing a silicon substrate having a third main surface and a fourth main surface opposite to the third main surface, said silicon substrate including a thermal oxidation film formed on the third main surface; and attaching the third main surface to the first main surface via the thermal oxidation film.

6 Claims, 5 Drawing Sheets

METHOD OF PRODUCING SEMICONDUCTOR DEVICE

BACKGROUND OF THE INVENTION AND RELATED ART STATEMENT

The present invention relates to a method of producing a semiconductor device. More specifically, the present invention relates to a method of producing a semiconductor device such as a high voltage power MOSFET (Metal Oxide Semiconductor Field Effect Transistor) formed on a silicon carbide substrate.

Conventionally, when a semiconductor device is formed on a silicon carbide substrate, first, a silicon carbide layer is formed on a seed substrate formed of silicon carbide with an epitaxial growth method, thereby preparing a silicon carbide substrate. Then, an N-type impurity is diffused in the silicon carbide substrate at a lower concentration to form an N drift diffusion layer.

In the next step, a resist mask is formed on the N drift diffusion layer through photolithography for exposing a forming area of a P well layer. After a P-type impurity formed of aluminum is implanted at a lower concentration to form a P low concentration implantation layer, a carbon film is formed to cover an upper surface of the silicon carbonate substrate to prevent an undulation called step bunching from forming.

In the next step, the P low concentration implantation layer is activated through a thermal processing at a high temperature higher than 1,600° C. to form the P well layer. When an MOSFET is formed, the upper surface of the silicon carbide substrate is thermally oxidized to form a gate oxidation film after the carbon film is removed (refer to Patent Reference).

Patent Reference: Japanese Patent Publication No. 2005-353771

The step bunching is an undulation formed on a surface through evaporation of silicon between crystal lattices when the silicon carbide substrate is exposed at a high temperature higher than 1,600° C., i.e., a specific phenomenon of a method in which a silicon carbide substrate with high temperature resistance is used.

In the conventional method, when the gate oxidation film of the MOSFET is formed, a thermal oxidation film is formed with the thermal oxidation method. Accordingly, when the thermal oxidation film is formed on the silicon carbide substrate normally required for a processing temperature higher than 1,600° C., the step bunching tends to be formed in an interface between the gate oxidation film formed of silicon oxide through the thermal oxidation and the silicon carbide substrate.

When the step bunching is formed, mobility of charges in a channel region decreases. Accordingly, a channel resistivity increases, thereby lowering an element characteristic of the semiconductor device.

In view of the problems described above, an object of the present invention is to provide a method of producing a semiconductor device capable of solving the problems of the conventional semiconductor device and the conventional method of producing the semiconductor device.

In the method of producing a semiconductor device of the present invention, it is possible to form a gate oxidation film formed of a thermal oxidation film on a silicon carbide substrate while maintaining flatness of an interface between the gate oxidation film and the silicon carbide substrate.

Further objects and advantages of the invention will be apparent from the following description of the invention.

SUMMARY OF THE INVENTION

In order to attain the objects described above, according to an aspect of the present invention, in a method of producing a semiconductor device, a silicon carbide substrate has a first main surface and a second main surface opposite to the first main surface. A first conductive type impurity is diffused in the silicon carbide substrate.

The method of producing a semiconductor device includes the steps of: forming a source layer with the first conductive type impurity diffused therein on the first main surface; forming a well layer with a second conductive type impurity diffused therein and having a polarity opposite to that of the first conductive type impurity to prepare the silicon carbide substrate; preparing a silicon substrate having a third main surface and a fourth main surface opposite to the third main surface in which a thermal oxidation film is formed on the third main surface; and attaching the third main surface to the first main surface.

In the present invention, it is possible to form a gate oxidation film formed of the thermal oxidation film through a thermal processing at a relatively low temperature. Accordingly, it is possible to form the gate oxidation film formed of the thermal oxidation film on the silicon carbide substrate while maintaining flatness of an interface between the gate oxidation film and the silicon carbide substrate and preventing step bunching from forming in the interface.

DETAILED DESCRIPTION OF PREFERRED EMBODIMENTS

Hereunder, preferred embodiments of the present invention will be explained with reference to the accompanying drawings.

First Embodiment

Figure 1:
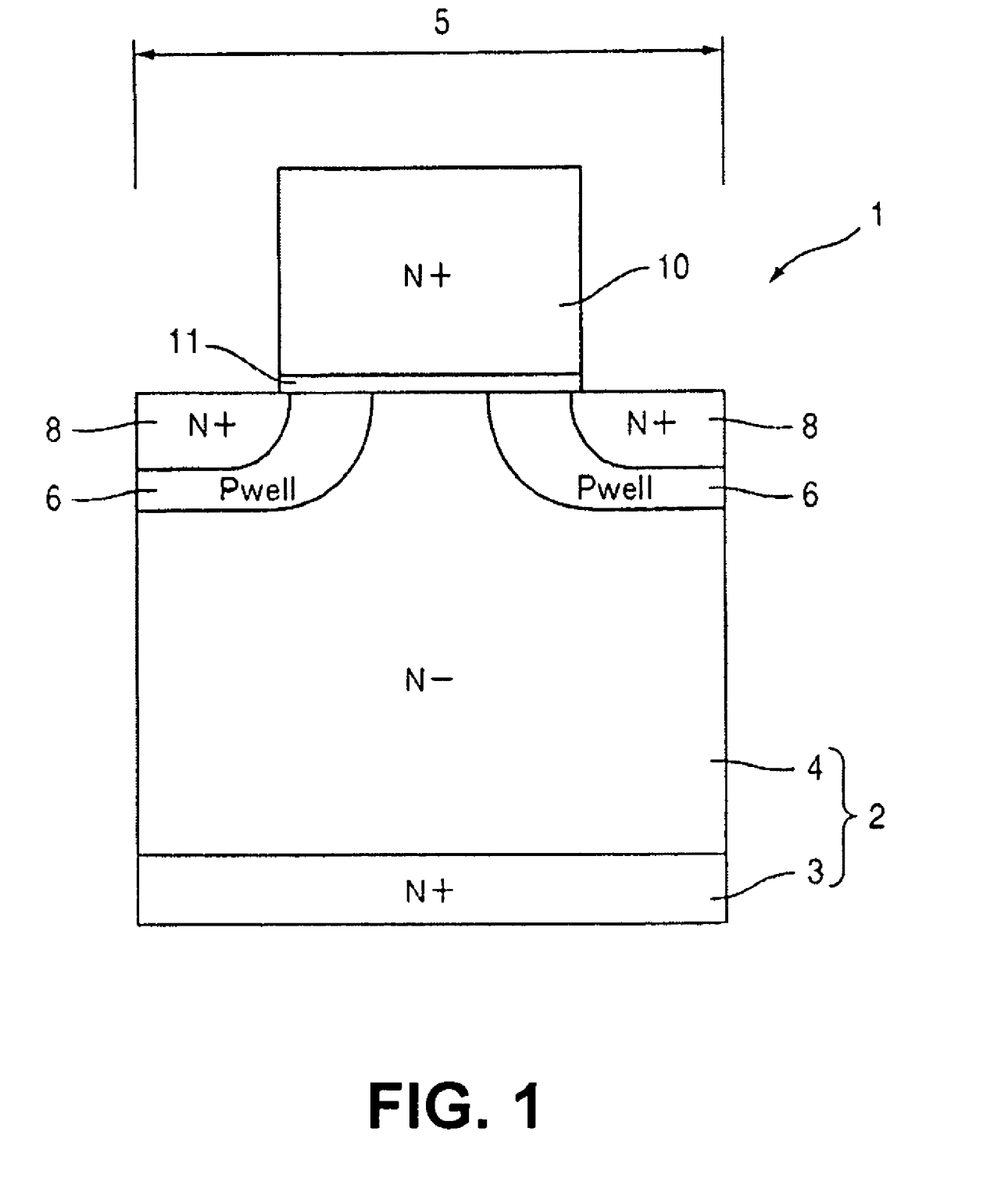
FIG. 1 is a schematic sectional view showing a semiconductor device according to a first embodiment of the present invention.
Figure 2:
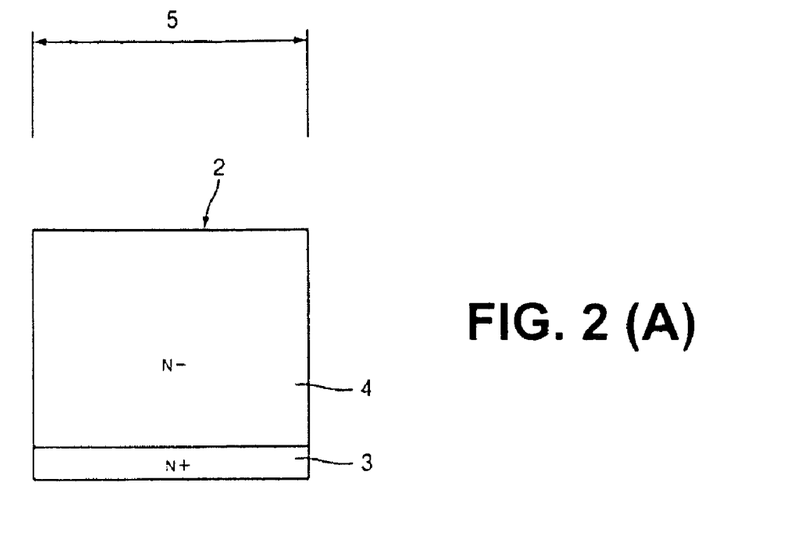
FIGS. 2(A) to 2(C) are schematic sectional views No. 1 showing a method of producing the semiconductor device according to the first embodiment of the present invention.
Figure 3:
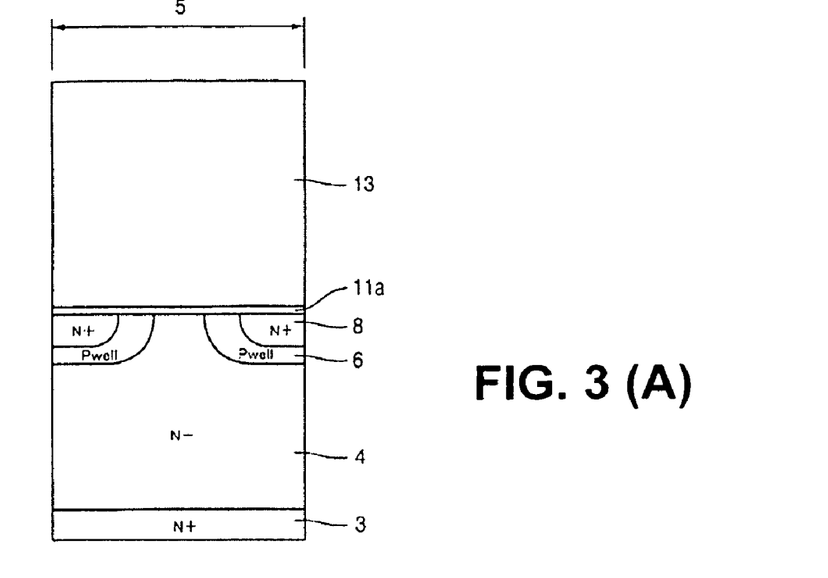
FIGS. 3(A) to 3(C) are schematic sectional views No. 2 showing the method of producing the semiconductor device according to the first embodiment of the present invention.

A first embodiment of the present invention will be explained. FIG. 1 is a schematic sectional view showing a semiconductor device according to the first embodiment of the present invention. FIGS. 2(A) to 2(C) are schematic sectional views No. 1 showing a method of producing the semiconductor device according to the first embodiment of the present invention. FIGS. 3(A) to 3(C) are schematic sectional views No. 2 showing the method of producing the semiconductor device according to the first embodiment of the present invention.

In the embodiment, the semiconductor device is an MOSFET 1 (Metal Oxide Semiconductor Field Effect Transistor) as a semiconductor element, more specifically, a high voltage N-channel MOSFET.

As shown in FIG. 1, a silicon carbide substrate 2 includes an upper surface as a first main surface and a lower surface as a second main surface opposite to the first main surface. In forming the silicon carbide substrate 2, a silicon carbide layer formed of silicon carbide is formed on a seed substrate with an epitaxial growth method.

In the embodiment, a drain layer 3 is formed on the lower surface of the silicon carbide substrate 2. An N-type impurity such as nitrogen as a first conductive type impurity is diffused in the drain layer 3 at a high concentration. A drift diffusion layer or an N drift diffusion layer 4 of the MOSFET 1 is formed in the silicon carbide substrate 2 as a portion except the drain layer 3. The N-type impurity such as nitrogen is diffused in the N drift diffusion layer 4 at a concentration lower than that in the drain layer 3.

In the embodiment, an element forming area 5 is defined on the silicon carbide substrate 2 for forming the MOSFET 1. Well layers or P well layers 6 as low concentration diffusion layers are formed on the upper surface of the silicon carbide substrate 2 at edge portions of the element forming area 5. In forming the P well layers 6, a P-type impurity such as aluminum (Al) as a second conductive type impurity with an opposite type the first conductive type impurity is implanted at a low concentration to form low concentration implantation layers or P low concentration implantation layers 6$a$(described later). Then, the P-type impurity is diffused through a thermal processing at a high temperature higher than 1,600° C. to form the P well layers 6.

In the embodiment, source layers 8 are formed in surface layers of the P low concentration implantation layers 6$a$ at edge portions of the element forming area 5. In forming the source layers 8, an N-type impurity such as phosphorus (P) is implanted at a high concentration to form high concentration implantation layers or N high concentration implantation layers 8$a$ (described later). Then, the N-type impurity is diffused through a thermal processing at a high temperature higher than 1,600° C. to form the source layers 8.

In the embodiment, the source layers 8 are formed at the edge portions of the element forming area 5 and are surrounded with the P well layers 6. Further, the P well layers 6 are arranged away from each other with the N drift diffusion layer 4 in between.

In the embodiment, a gate electrode 10 is formed on the silicon carbide substrate 2 in an area except the source layers 8, that is, an area between the source layers 8 where the P well layers 6 and the N drift diffusion layer 4 are formed. The gate electrode 10 is formed of an electrode material such as polysilicon containing an N-type impurity at a relatively high concentration. The gate electrode 10 is arranged on the silicon carbide substrate 2 with a gate oxidation film 11 in between.

As shown in FIG. 3(A) to 3(C), in forming the gate oxidation film 11, there is prepared a silicon substrate 13 formed a silicon layer made of silicon (Si) and having one surface as a third main surface and the other surface as a fourth main surface opposite to the third main surface. Then, a thermal oxidation film 11$a$ formed of silicon oxide ($SiO_2$) is formed on the one surface of the silicon substrate 13 through a thermal oxidation method. After the thermal oxidation film 11$a$ is formed, the thermal oxidation film 11$a$ is attached to the upper surface of the silicon carbide substrate 2, so that the gate oxidation film 11 is formed as an insulation thin film.

In the embodiment, the gate oxidation film 11 is disposed between the gate electrode 10 and the P well layers 6 and the N drift diffusion layer 4 of the silicon carbide substrate 2. A channel of the MOSFET 1 is formed in surface layers of the P well layers 6 facing the gate electrode 10 with the gate oxidation film 11 in between.

A method of producing the semiconductor device will be explained with reference to FIG. 2(A) to 2(C) and FIG. 3(A) to 3(C).

As shown in FIG. 2(A), first, the silicon carbide substrate 2 and the silicon substrate 13 (refer to FIG. 3(A)) are prepared. As described above, the silicon carbide substrate 2 includes the drain layer 3 formed on the lower surface thereof, in which the N-type impurity such as nitrogen is diffused at a high concentration. Further, the silicon carbide substrate 2 includes the N drift diffusion layer 4 with the N-type impurity such as nitrogen diffused therein at a concentration lower than that in the drain layer 3. The silicon substrate 13 includes the thermal oxidation film 11$a$ formed on one surface of the silicon layer through a thermal oxidation method. Then, the element forming area 5 is defined on the silicon carbide substrate 2.

In the next step, as shown in FIG. 2(B), a resist mask is formed on the N drift diffusion layer 4 of the silicon carbide substrate 2 through photolithography for exposing the N drift diffusion layer 4 in forming areas of the P low concentration implantation layers at the edge portions of the element forming area 5. Then, using the resist mask as a mask, a P-type impurity such as aluminum is implanted at a lower concentration to form the P low concentration implantation layers 6$a$.

In the next step, after the resist mask is removed, another resist mask is formed through photolithography for exposing the P low concentration implantation layers 6$a$ in forming areas of the N high concentration implantation layers 8$a$ at edge portions of the P low concentration implantation layers 6$a$ of the element forming area 5. Then, using the resist mask as a mask, an N-type impurity such as phosphorous is implanted at a concentration higher that that of the silicon carbide substrate 2 to form the N high concentration implantation layers 8$a$. Afterward, the resist mask is removed.

In the next step, as shown in FIG. 2(C), the impurities in the P low concentration implantation layers 6$a$ and the N high concentration implantation layers 8$a$ are activated through a thermal processing at a temperature higher than 1,600° C., preferably between 1,600° C. and 1,800° C., to form the P well layers 6 with the P-type impurity diffused therein at a low concentration and the source layers 8 with the N-type impurity diffused therein at a high concentration.

In the next step, the upper surface of the silicon carbide substrate 2, where the P well layers 6 and the source layers 8 are formed, is polished with a CMP (Chemical Mechanical Polishing) method for removing step bunching generated on the upper surface of the silicon carbide substrate 2 through the thermal processing at the high temperature, thereby flattening the upper surface of the silicon carbide substrate 2.

In the next step, as shown in FIG. 3(A), the thermal oxidation film 11$a$ formed on the one surface of the silicon substrate 13 is attached to the upper surface of the silicon carbide substrate 2. The other surface of the silicon substrate 13 is pushed for temporarily fixing the thermal oxidation film 11$a$ to the upper surface of the silicon carbide substrate 2. Then, the silicon carbide substrate 2 and the silicon substrate 13 are thermally processes at a relatively low temperature, preferably between 1,100° C. and 1,300° C., with a firm fixing method, so that the thermal oxidation film 11$a$ is firmly fixed to the upper surface of the silicon carbide substrate 2.

In the next step, as shown in FIG. 3(B), after the silicon substrate 13 is attached to the silicon carbide substrate 2, the silicon layer of the silicon substrate 13 is removed through wet etching to expose the thermal oxidation film 11a, thereby forming the gate oxidation film 11 formed of the thermal oxidation film 11a on a whole surface of the silicon carbide substrate 2.

In the next step, as shown in FIG. 3(C), poly-silicon containing an N-type impurity such as phosphorous at a high concentration is deposited to have a relatively large thickness on a whole surface of the gate oxidation film 11 to form an electrode material layer. Then, a resist mask is formed on the electrode material layer through photolithography for covering a forming area of the gate electrode 10 between the source layers 8 of the element forming area 5. Using the resist mask as a mask, the electrode material layer and the gate oxidation film 11 are removed through anisotropy etching to expose upper surfaces of the source layers 8 of the silicon carbide substrate 2, thereby forming the gate oxidation film 11.

In the next step, a source contact and a gate contact (not shown) are formed using a conductive material such as aluminum for electrically connecting the source layers 8 and the gate electrode 10, respectively, thereby forming the MOSFET 1 shown in FIG. 1.

As described above, in the embodiment, when the MOSFET 1 is produced using the silicon carbide substrate 2, the diffusion layers such as the drain layer 3, the P well layers 6, and the source layers 8, which require the thermal processing at a temperature higher than 1,600° C., are formed in advance. Then, the upper surface of the silicon carbide substrate 2 is polished with the CMP method for removing step bunching generated on the upper surface of the silicon carbide substrate 2 through the thermal processing, thereby flattening the upper surface of the silicon carbide substrate 2.

Afterward, the thermal oxidation film 11a, which is formed in the silicon substrate 13 with the thermal oxidation method, is attached to the upper surface of the silicon carbide substrate 2 through the thermal processing at a relatively low temperature such as 1,200° C., thereby forming the gate oxidation film 11 formed of the thermal oxidation film 11a.

Accordingly, in the embodiment, when the gate oxidation film 11 is formed, step bunching is not generated in an interface between the gate oxidation film 11 and the silicon carbide substrate 2. As a result, it is possible to form the gate oxidation film 11 formed of the thermal oxidation film 11a on the silicon carbide substrate 2 while maintaining flatness of the interface. Further, it is possible to prevent mobility of charges in the channel area from decreasing, and to reduce a channel resistivity, thereby improving an element characteristic of the MOSFET 1.

In the embodiment, before the gate oxidation film 11 is formed, the steps requiring the thermal processing at a high temperature are completed. Accordingly, after the gate oxidation film 11 is formed, a defect such as step bunching is not generated in the interface between the gate oxidation film 11 and the silicon carbide substrate 2, thereby making it possible to produce the MOSFET 1 with an improved element characteristic.

As described above, in the step shown in FIG. 3(B), the silicon layer of the silicon substrate 13 is removed through wet etching. Alternatively, after the thermal oxidation film 11a is formed in the silicon substrate 13, hydrogen ions are implanted into the silicon substrate 13 at position away from the thermal oxidation film 11a to form a hydrogen implanted layer. After the thermal oxidation film 11a is temporarily attached to the silicon carbide substrate 2, the hydrogen implanted layer is removed through a thermal processing at a temperature of about 500° C. Then, the silicon layer remaining on the thermal oxidation film 11a is removed through dry etching or with the CMP method to expose the thermal oxidation film 11a. Afterward, the thermal oxidation film 11a is firmly fixed through a thermal processing at a low temperature of about 1,200° C. With the alternative method, it is possible to remove the silicon layer of the silicon substrate 13 in a shorter period of time.

As described above, in the embodiment, the silicon carbide substrate has the first main surface and the second main surface opposite to the first main surface. The first conductive type impurity is diffused in the silicon carbide substrate.

The source layer with the first conductive type impurity diffused therein is formed in the silicon carbide substrate. The well layer with the second conductive type impurity opposite to the first conductive type impurity diffused therein is formed in the silicon carbide substrate.

The silicon substrate has the third main surface and the fourth main surface opposite to the third main surface in which a thermal oxidation film is formed on the third main surface. The first main surface is attached to the third main surface. Accordingly, it is possible to form the gate oxidation film formed of the thermal oxidation film through the thermal processing at a relatively low temperature.

Further, it is possible to form the gate oxidation film formed of the thermal oxidation film on the silicon carbide substrate while maintaining flatness of an interface between the gate oxidation film and the silicon carbide substrate and preventing step bunching from forming in the interface. Further, it is possible to prevent mobility of charges in the channel area from decreasing, and to reduce a channel resistivity, thereby improving an element characteristic of the MOSFET.

Second Embodiment

A second embodiment of the present invention will be explained next. Components in the second embodiment similar to those in the first embodiment are designated with the same reference numerals, and explanations thereof are omitted.

Figure 4:
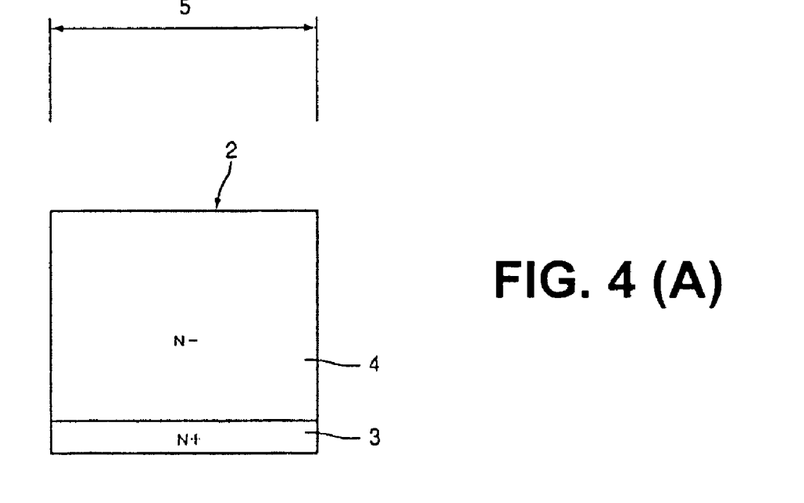
FIGS. 4(A) to 4(C) are schematic sectional views No. 1 showing a method of producing a semiconductor device according to a second embodiment of the present invention.
Figure 5:
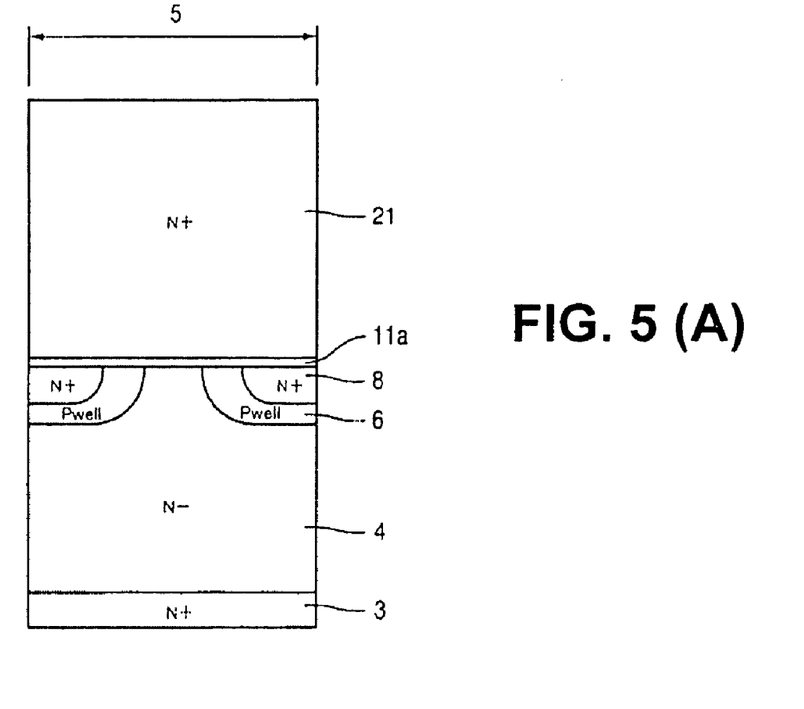
FIGS. 5(A) and 5(B) are schematic sectional views No. 2 showing the method of producing the semiconductor device according to the second embodiment of the present invention.

FIGS. 4(A) to 4(C) are schematic sectional views No. 1 showing a method of producing a semiconductor device according to the second embodiment of the present invention. FIGS. 5(A) and 5(B) are schematic sectional views No. 2 showing the method of producing the semiconductor device according to the second embodiment of the present invention.

In the embodiment, in a silicon substrate 21 to be prepared in advance, the thermal oxidation film 11a is formed on one surface of the silicon layer similar to the silicon substrate 13 in the first embodiment (refer to FIG. 5(A)). An N-type impurity such as phosphorous is diffused in the silicon layer at a high concentration such as $1 \times 10^{20}/cm^3$. A gate electrode 22 is formed using the silicon layer.

A method of producing the semiconductor device will be explained with reference to FIG. 4(A) to 4(C) and FIG. 5(A) to 5(C).

As shown in FIG. 4(A), first, the silicon carbide substrate 2 and the silicon substrate 21 (refer to FIG. 5(A)) are prepared. Similar to the first embodiment, the silicon carbide substrate 2 includes the drain layer 3 and the N drift diffusion layer 4. The silicon substrate 21 includes the thermal oxidation film 11a formed on one surface of the silicon layer through a thermal oxidation method. Then, the element forming area 5 is defined on the silicon carbide substrate 2.

The following steps shown in FIGS. 4(B), 4(C), and 5(A) are similar to those shown in FIGS. 2(B), 2(C), and 3(A), and explanation thereof are omitted.

As shown in FIG. 5(A), the silicon substrate 21 is placed on the upper surface of the silicon carbide substrate 2, so that the thermal oxidation film 11a is attached to the upper surface of the silicon carbide substrate 2.

In the next step, as shown in FIG. 5(B), after the silicon substrate 21 is attached to the silicon carbide substrate 2, a resist mask is formed on the other surface of the silicon substrate 21 through photolithography for covering a forming area of the gate electrode 22 between the source layers 8 of the element forming area 5. Using the resist mask as a mask, the silicon layer of the silicon substrate 21 and the thermal oxidation film 11a are removed through anisotropy etching to expose upper surfaces of the source layers 8 of the silicon carbide substrate 2, thereby forming the gate electrode 22 facing the N drift diffusion layer 4 and the P well layers 6 of the silicon carbide substrate 2 with the gate oxidation film 11 formed of the thermal oxidation film 11a in between.

In the next step, similar to the first embodiment, a source contact and a gate contact (not shown) are formed, thereby forming the MOSFET 1.

As described above, in the embodiment, the silicon layer of the silicon substrate 21, in which the N-type impurity is diffused in advance at a high concentration, is etched to form the gate electrode 22. Accordingly, as opposed to the first embodiment, it is possible to eliminate the step of depositing the poly-silicon to form the gate electrode 10, thereby reducing the number of the steps and making the method of producing the MOSFET 1 simple.

As described above, in the embodiment, the silicon substrate is prepared in advance to have the thermal oxidation film formed on one surface of the silicon layer with the N-type impurity diffused therein at a high concentration. After the thermal oxidation film of the silicon substrate is attached to the upper surface of the silicon carbide substrate, the silicon layer of the silicon substrate and the thermal oxidation film attached to the silicon carbide substrate are etched to form the gate electrode facing the silicon carbide substrate with the gate oxidation film formed of the thermal oxidation film in between.

Accordingly, in addition to the effects in the first embodiment, it is possible to eliminate the step of depositing the poly-silicon to form the gate electrode, thereby reducing the number of the steps and making the method of producing the MOSFET simple.

In the embodiments described above, the silicon substrate is attached to the silicon carbide substrate, and the silicon substrate has the silicon layer with the N-type impurity diffused therein at a high concentration. Alternatively, an aluminum substrate may be attached to the silicon carbide substrate. In this case, the aluminum substrate is formed of metal aluminum having an oxidized surface. The aluminum substrate may be etched to form a gate electrode formed of aluminum, thereby making it possible to eliminate the step of depositing the poly-silicon.

In the embodiments described above, the semiconductor element is the N-channel MOSFET, and is not limited thereto. The present invention may be applicable to a P-channel MOSFET, in which each diffusion layer has an opposite polarity, and still be able to provide similar effects.

The disclosure of Japanese Patent Application No. 2007-294819, filed on Nov. 13, 2007, is incorporated in the application by reference.

While the invention has been explained with reference to the specific embodiments of the invention, the explanation is illustrative and the invention is limited only by the appended claims.

What is claimed is:

1. A method of producing a semiconductor device, comprising:
   preparing a silicon carbide substrate having a first main surface and a second main surface opposite to the first main surface, said silicon carbide substrate forming a first conductive type impurity diffused region on the first main surface therein;
   preparing a silicon substrate having a third main surface and a fourth main surface opposite to the third main surface, said silicon substrate including a thermal oxidation film formed on the third main surface; and
   attaching the third main surface to the first main surface via the thermal oxidation film.

2. The method of producing the semiconductor device according to claim 1, further comprising:
   forming a well layer with a second conductive type impurity diffused therein and having a polarity opposite to that of the first conductive type impurity; and
   attaching the third main surface to the first main surface.

3. The method of producing the semiconductor device according to claim 1, further comprising:
   forming a drain layer with a first conductive type impurity diffused therein on the second main surface;
   forming a drift diffusion layer with the first conductive type impurity diffused therein at a concentration lower than that of the drain layer on the silicon carbide substrate in an area where the drain layer is not formed;
   forming a silicon layer with the first conductive type impurity diffused therein in the silicon substrate;
   implanting a second conductive type impurity having a polarity opposite to that of the first conductive type impurity into the first main surface to form a low concentration implantation layer;
   implanting the first conductive type impurity into the low concentration implantation layer at a concentration higher than that of the drift diffusion layer to form a high concentration implantation layer; and
   activating the low concentration implantation layer and the high concentration implantation layer through a thermal processing to form a well layer and a source layer;
   flattening the first main surface.

4. The method of producing a semiconductor device according to claim 3, further comprising, after attaching the third main surface to the first main surface, removing the silicon layer and the thermal oxidation film to expose the source layer so that a gate electrode is formed to face the silicon carbide substrate with a gate oxidation film formed of the thermal oxidation film in between.

5. The method of producing the semiconductor device according to claim 1, further comprising:
   forming a source layer with the first conductive type impurity diffused therein on the first main surface;
   forming a well layer with a second conductive type impurity diffused therein and having a polarity opposite to that of the first conductive type impurity on the first main surface in an area surrounding the source layer;
   forming a silicon layer with the first conductive type impurity diffused therein in the silicon substrate; and
   removing the silicon layer and the thermal oxidation film to expose the source layer so that a gate electrode is formed to face the silicon carbide substrate with a gate oxidation film formed of the thermal oxidation film in between.

6. The method of producing the semiconductor device according to claim 1, further comprising:
   forming a drain layer with a first conductive type impurity diffused therein on the second main surface;

forming a drift diffusion layer with the first conductive type impurity diffused therein at a concentration lower than that of the drain layer on the silicon carbide substrate in an area where the drain layer is not formed;

implanting the first conductive type impurity into the silicon substrate;

forming a silicon layer with the first conductive type impurity diffused therein in the silicon substrate;

implanting a second conductive type impurity having a polarity opposite to that of the first conductive type impurity into the first main surface to form a low concentration implantation layer;

implanting the first conductive type impurity into the low concentration implantation layer at a concentration higher than that of the drift diffusion layer to form a high concentration implantation layer;

activating the low concentration implantation layer and the high concentration implantation layer through a thermal processing to form a well layer and a source layer;

flattening the first main surface;

attaching the third main surface to the first main surface; and removing the silicon layer and the thermal oxidation film to expose the source layer so that a gate electrode is formed to face the silicon carbide substrate with a gate oxidation film formed of the thermal oxidation film in between.

* * * * *